(12) United States Patent
Ariyoshi

(10) Patent No.: US 8,470,677 B2
(45) Date of Patent: Jun. 25, 2013

(54) METHOD OF MANUFACTURING SEMICONDUCTOR DEVICE

(75) Inventor: Junichi Ariyoshi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 47 days.

(21) Appl. No.: 13/311,866

(22) Filed: Dec. 6, 2011

(65) Prior Publication Data

US 2012/0214283 A1 Aug. 23, 2012

(30) Foreign Application Priority Data

Feb. 23, 2011 (JP) ................... 2011-036704

(51) Int. Cl.
*H01L 21/8238* (2006.01)
*H01L 21/8234* (2006.01)
*H01L 27/088* (2006.01)
*H01L 27/06* (2006.01)

(52) U.S. Cl.
CPC *H01L 21/823807* (2013.01); *H01L 21/823814* (2013.01); *H01L 21/823842* (2013.01); *H01L 21/823857* (2013.01); *H01L 27/0617* (2013.01); *H01L 27/088* (2013.01)
USPC ........... 438/302; 438/307; 438/525; 438/529; 438/546; 257/368; 257/392

(58) Field of Classification Search
USPC .......................... 438/197, 217, 231, 277, 278
See application file for complete search history.

(56) References Cited

U.S. PATENT DOCUMENTS

| | | | | |
|---|---|---|---|---|
| 5,830,795 A | * | 11/1998 | Mehta et al. | 438/275 |
| 5,847,432 A | * | 12/1998 | Nozaki | 257/369 |
| 6,184,094 B1 | * | 2/2001 | Goto | 438/276 |
| 6,267,479 B1 | | 7/2001 | Yamada et al. | |

FOREIGN PATENT DOCUMENTS

JP 2000-068389 A 3/2000

* cited by examiner

*Primary Examiner* — Olik Chaudhuri
*Assistant Examiner* — Wilner Jean Baptiste
(74) *Attorney, Agent, or Firm* — Fujitsu Patent Center

(57) ABSTRACT

Gate electrodes are formed in a high speed transistor forming region, a low leakage transistor forming region, and a medium voltage transistor forming region, respectively. Thereafter, a photoresist film covering the medium voltage transistor forming region is formed. Then, ions of an impurity are implanted into a semiconductor substrate while using the photoresist film and the gate electrodes as a mask, and p-type pocket regions, extension regions, and impurity regions are thereby formed. Subsequently, another photoresist film covering the high speed transistor forming region is formed. Then, ions of an impurity are implanted into the semiconductor substrate while using the other photoresist film and the gate electrodes as a mask, and impurity regions and extension regions are thereby formed.

8 Claims, 14 Drawing Sheets

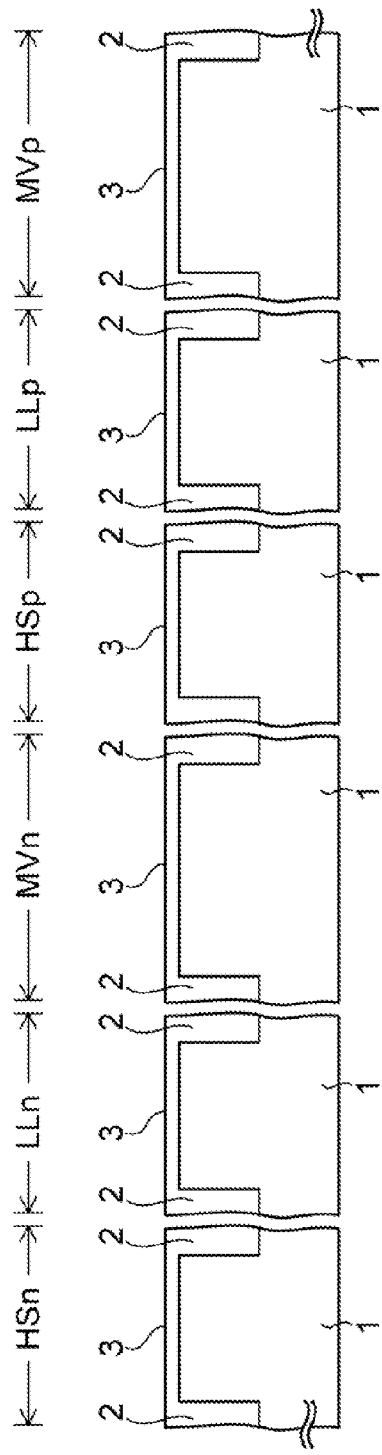
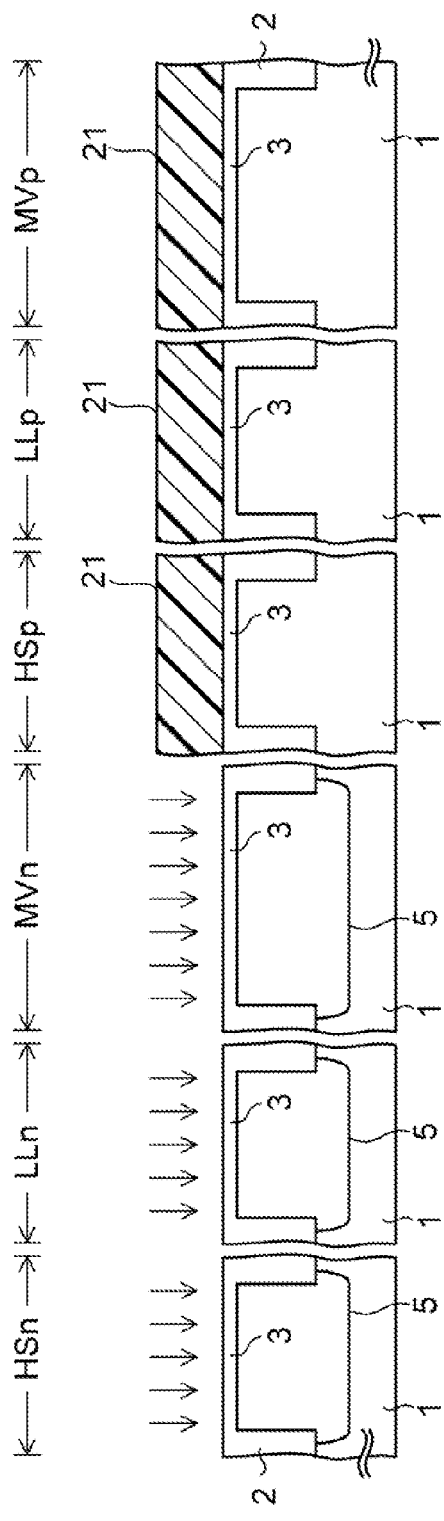

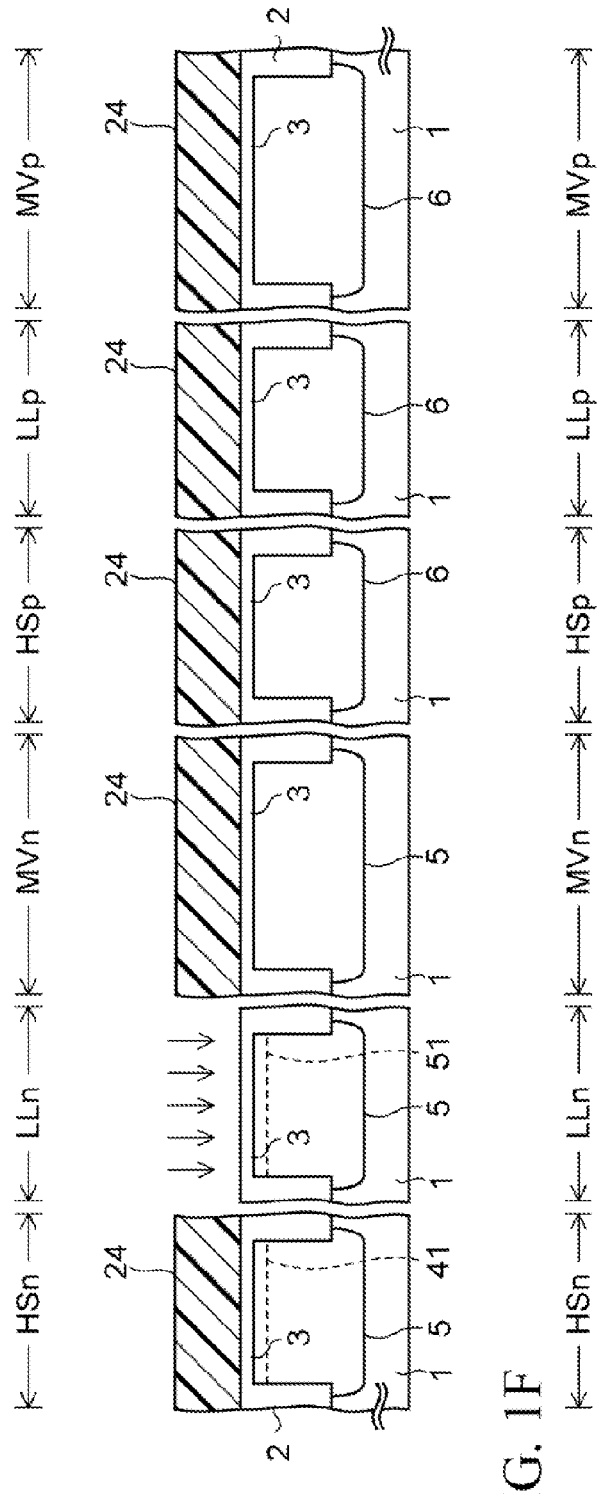
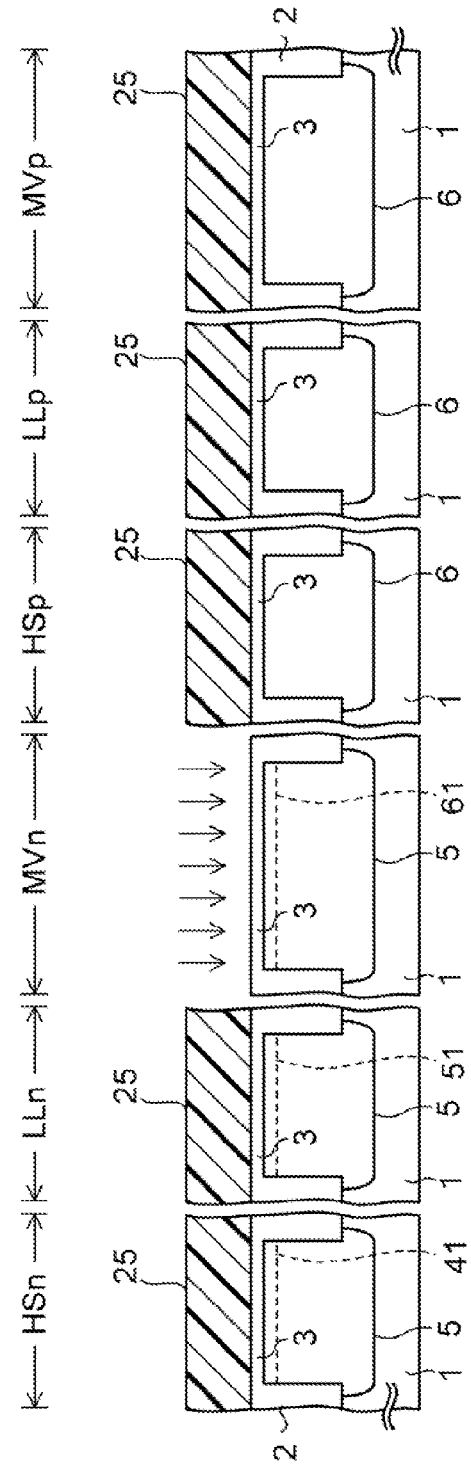

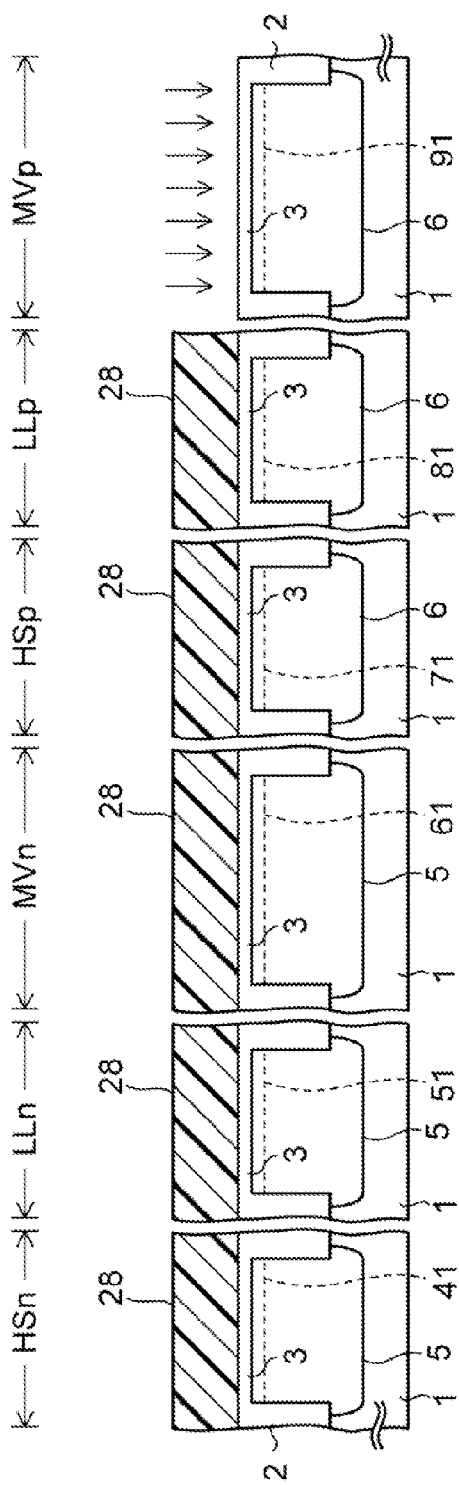

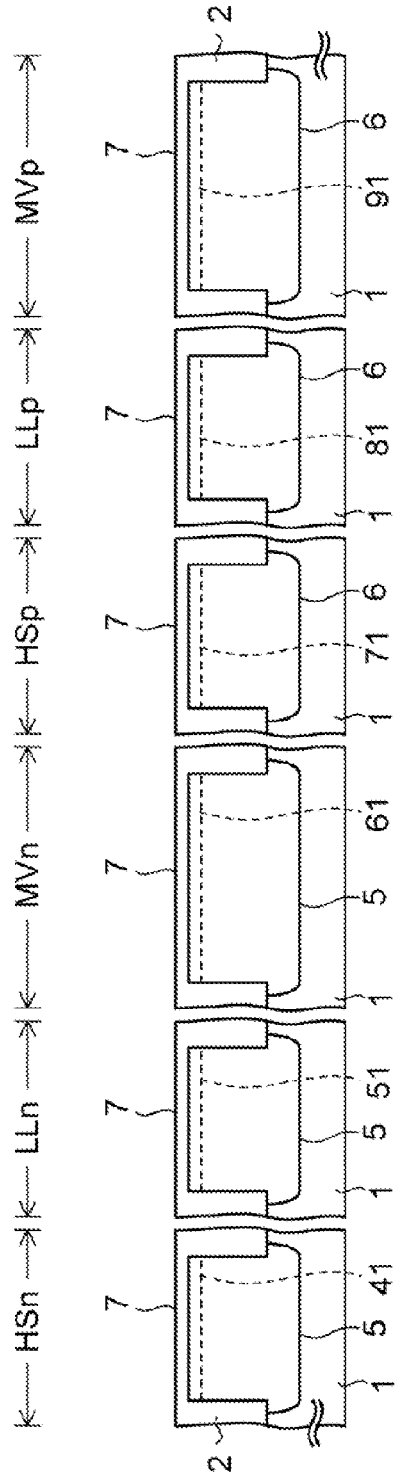
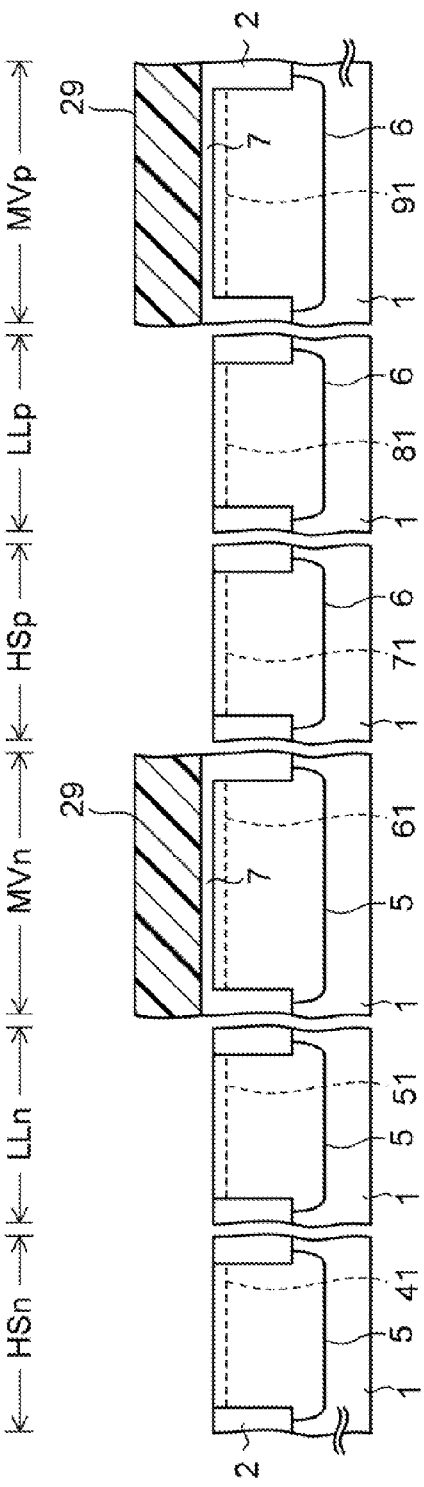

METHOD OF MANUFACTURING SEMICONDUCTOR DEVICE

CROSS-REFERENCE TO RELATED APPLICATION

This application is based upon and claims and the benefit of priority of the prior Japanese Patent Application No. 2011-036704, filed on Feb. 23, 2011, the entire contents of which are incorporated herein by reference.

FIELD

The embodiment discussed herein relates to a method of manufacturing a semiconductor device.

BACKGROUND

With recent improvements in performances of electronic devices, there have been adopted configurations where several types of MOS transistors different in operating voltage and operating speed are mounted on a single semiconductor substrate.

A MOS transistor includes impurity regions such as a channel region, source and drain regions, extension regions, and pocket regions. Among them, the channel region is an impurity region provided in the semiconductor substrate between the source and drain regions. An impurity concentration of the channel region relates to a threshold voltage of the MOS transistor.

The extension regions are impurity regions provided between the channel region and the source and drain regions, respectively, and are formed to have a lower impurity concentration than the source and drain regions. The extension regions may prevent concentration of a high electric field between the channel region and the source and drain regions and suppress generation of hot carriers.

Further, the pocket regions are impurity regions formed by doping an impurity into the semiconductor substrate below a gate electrode, the impurity having an opposite conductivity type to the conductivity type of the source and drain regions. The pocket regions are provided to suppress a short channel effect between the source and drain regions.

These impurity regions are individually formed by implanting ions of the impurities into the semiconductor substrate. However, in a product in which several types of MOS transistors are mounted as described above, such a configuration leads to an increase in the number of ion implantation processes and thereby to an increase in manufacturing costs.
Patent Document 1: Japanese Laid-open Patent Publication No. 2000-68389

SUMMARY

One aspect provides a method of manufacturing a semiconductor device, the method including: forming a first gate insulating film in a first region of a semiconductor substrate; forming a second gate insulating film being thinner than the first gate insulating film in each of a second region and a third region of the semiconductor substrate; forming a first gate electrode, a second gate electrode, and a third gate electrode respectively on the first and second gate insulating films in the first region, the second region, and the third region; forming a first resist film covering the first region and having openings in the second region and the third region; forming pocket regions respectively on both sides of each of the second gate electrode and the third gate electrode by implanting ions of a first impurity of a first conductivity type into the semiconductor substrate while using the first resist film, the second gate electrode, and the third gate electrode as a mask; forming first extension regions respectively on both sides of the second gate electrode and first impurity regions respectively on both sides of the third gate electrode by implanting ions of a second impurity of a second conductivity type into the semiconductor substrate down to a depth shallower than the ions of the first impurity while using the first resist film as a mask; after removing the first resist film, forming a second resist film covering the second region and having openings in the first region and the third region; forming third extension regions respectively on both sides of the first gate electrode and second impurity regions respectively on both sides of the third gate electrode by implanting ions of a third impurity of the second conductivity type into the semiconductor substrate down to a depth shallower than the ions of the first impurity and deeper than the ions of the second impurity while using the second resist film, the first gate electrode, and the third gate electrode as a mask; and after removing the second resist film, forming source and drain regions respectively on both sides of each of the first gate electrode, the second gate electrode, and the third gate electrode by implanting ions of a fourth impurity of the second conductivity type into the semiconductor substrate down to a depth deeper than the ions of the first impurity.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Prior to describing embodiment, a prelude for facilitating understandings of the embodiment will be described below.

With recent improvements of performances and reduction of power consumption in electronic devices, it has become more common that a transistor operable at a high speed (hereinafter referred to as a high speed transistor) and a transistor operable with a lower leakage current (hereinafter referred to as a low leakage transistor) are incorporated in a semiconductor device (a semiconductor chip). The high speed transistor consumes relatively high power but has an advantage of a high operating speed. On the other hand, the low leakage transistor consumes low power and is used in a circuit (such as a clock circuit) which is operated in a stand-by mode of the semiconductor device, for example.

The high speed transistor and the low leakage transistor are generally operated at a low voltage around 1.2 V. Meanwhile, a source voltage supplied to the semiconductor device is often around 3.3 V or 5 V (hereinafter referred to as a medium voltage), for example. Accordingly, transistors operable at the medium voltage (hereinafter referred to medium voltage transistors) are mounted on a power circuit and an interface circuit in the semiconductor device.

In order to mount the aforementioned high speed transistor, low leakage transistor, and medium voltage transistor in the same semiconductor device, several types of impurity regions different in impurity concentration and impurity concentration distribution are formed in the semiconductor device.

For example, in the high speed transistor, it is preferable to design the pocket regions and extension regions to have steep impurity profiles for suppressing short channel effects. In contrast, in the low leakage transistor, it is preferable to design the pocket regions and extension regions to have relatively gentle impurity profiles for suppressing leakage currents from pn junctions between the extension regions and wells.

Further, in the medium voltage transistor, impurity concentrations in channel regions and extension regions are set to values different from those in the high speed transistor, the low leakage transistor, and the like. Note that, the medium voltage transistor is usually not provided with pocket regions because of a relatively large gate length.

The number of processes is increased and the manufacturing costs are eventually increased if the impurity regions in the high speed transistor, the low leakage transistor, and the medium voltage transistor mentioned above are formed by individual ion implantation processes.

Now, an embodiment will be described with reference to the accompanying drawings.

Figure 1C:
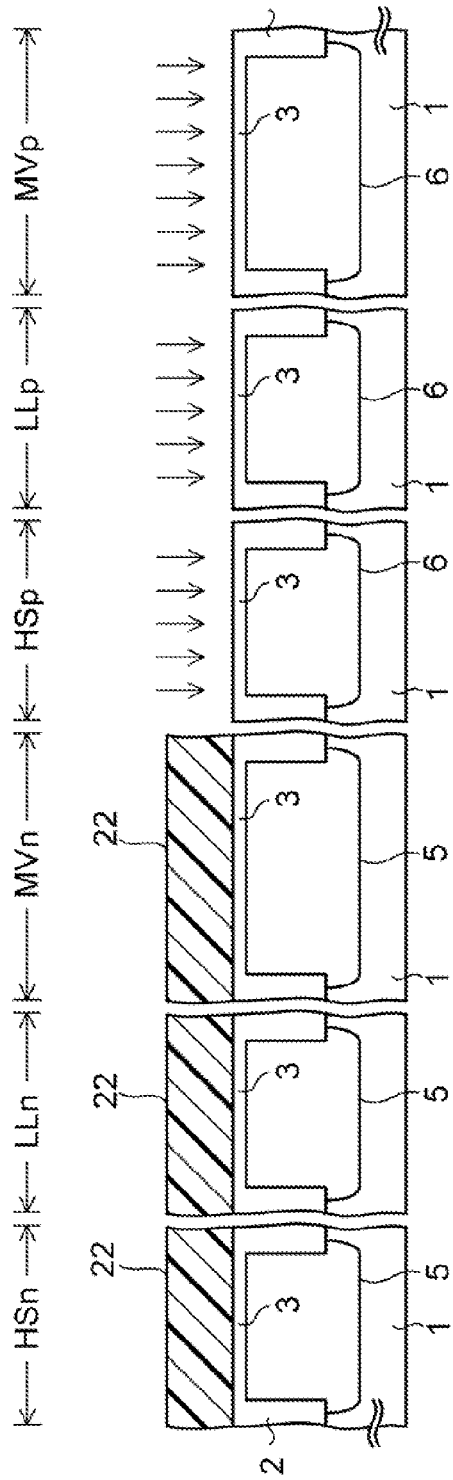
FIGS. 1A to 1Z are cross-sectional views illustrating an example of a method of manufacturing a semiconductor device of an embodiment.
Figure 1D:
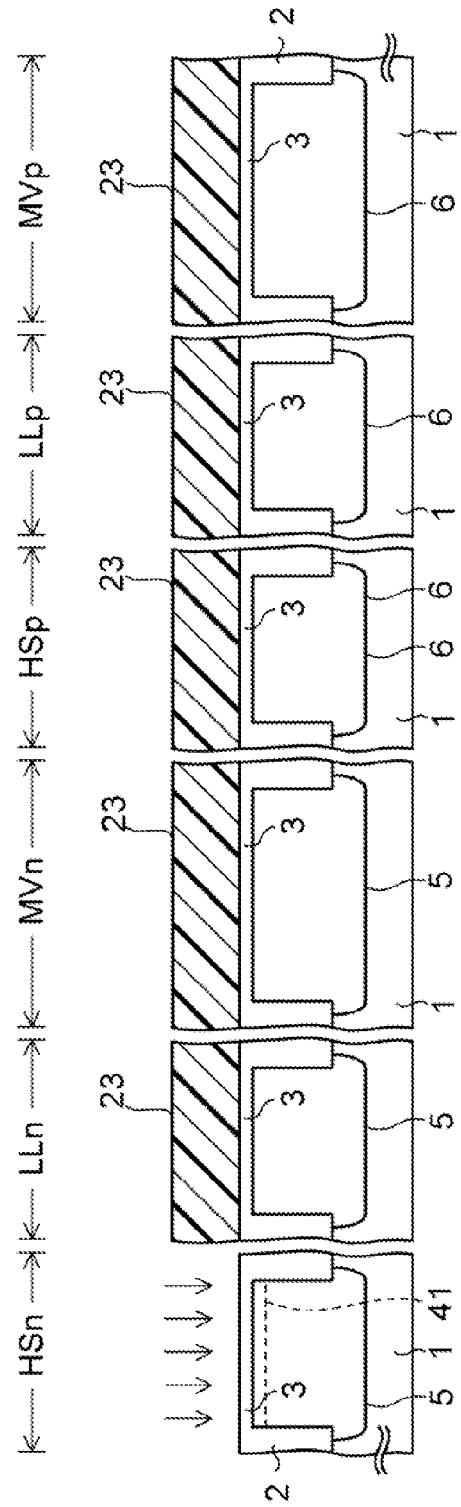
Figure 1G:
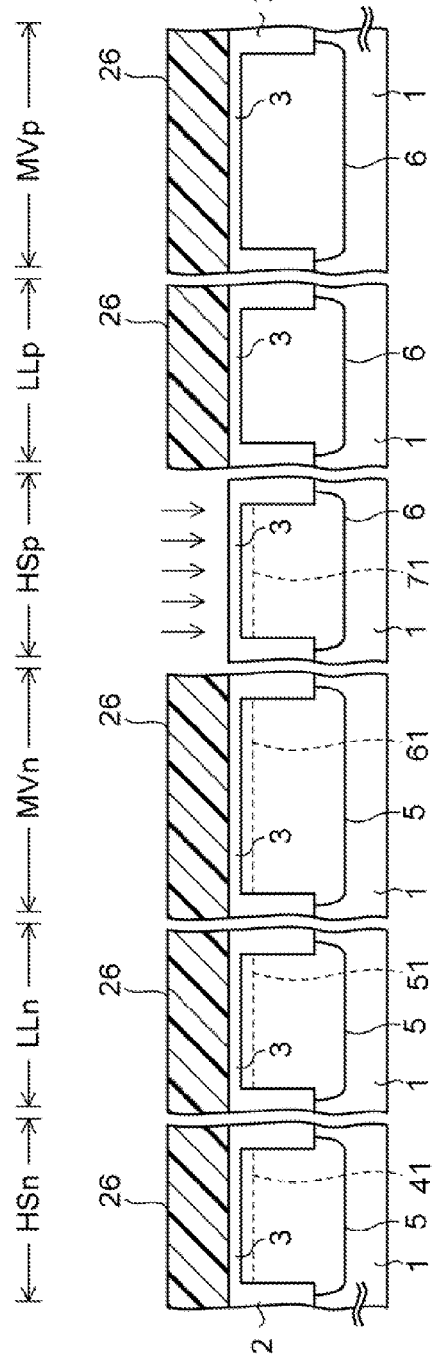
Figure 1H:
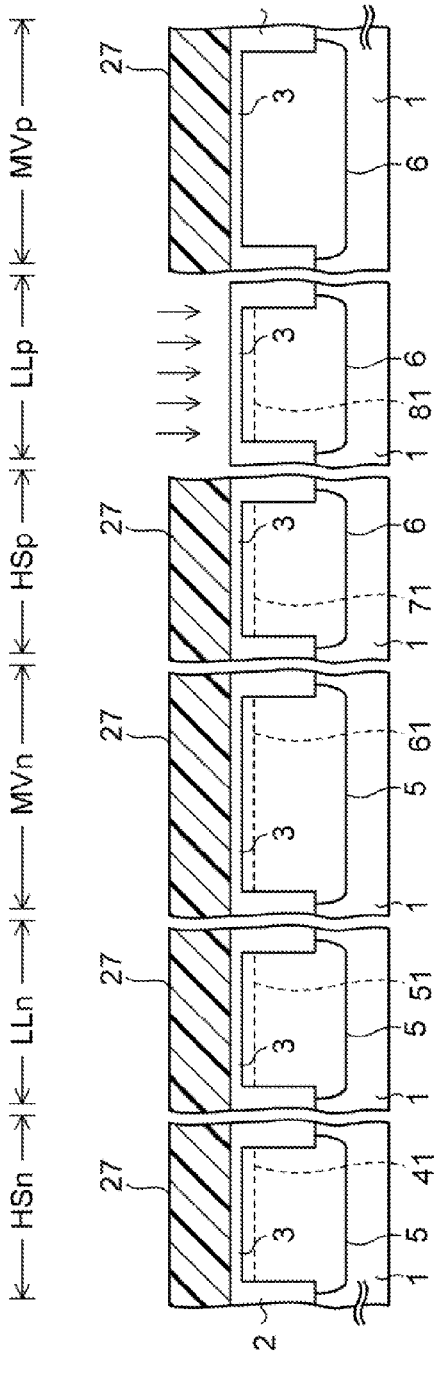
Figure 1M:
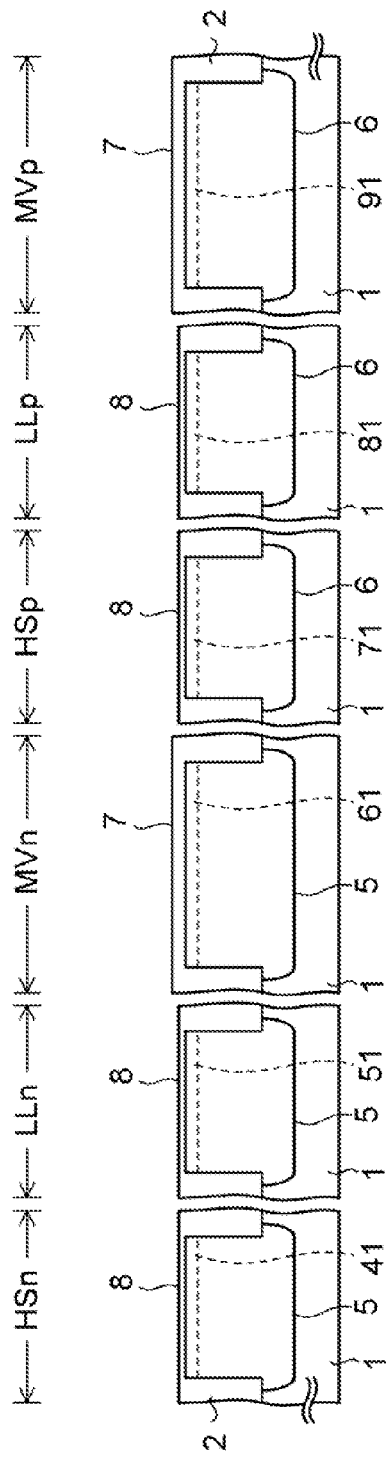
Figure 1N:
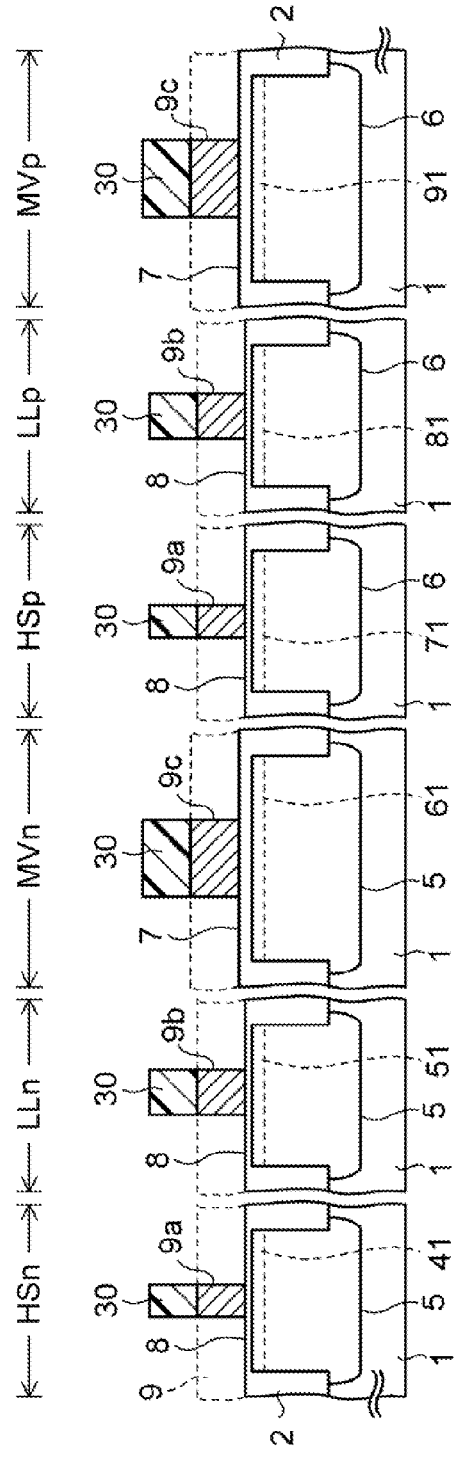
Figure 1O:
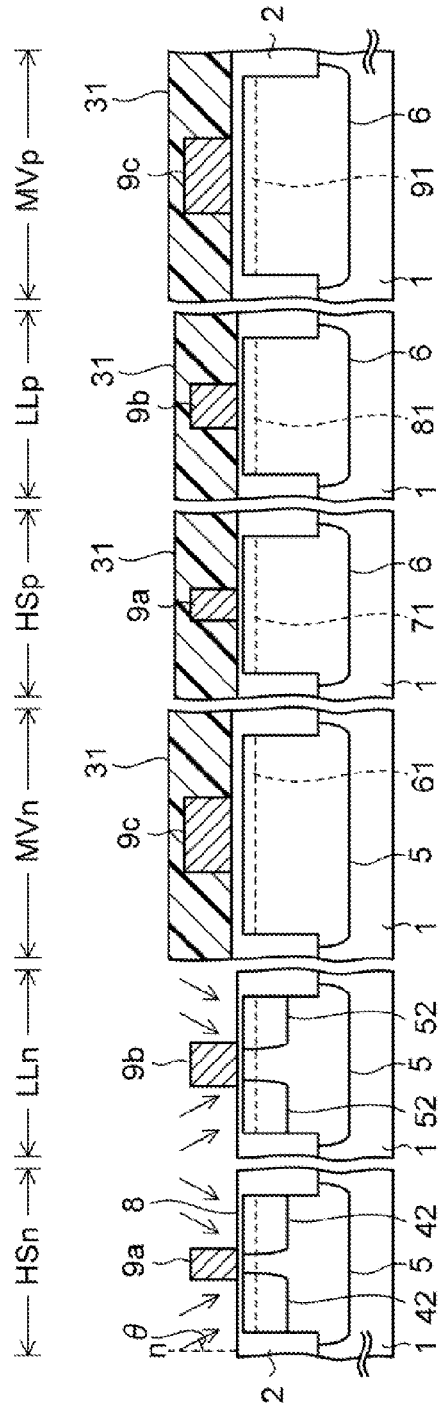
Figure 1P:
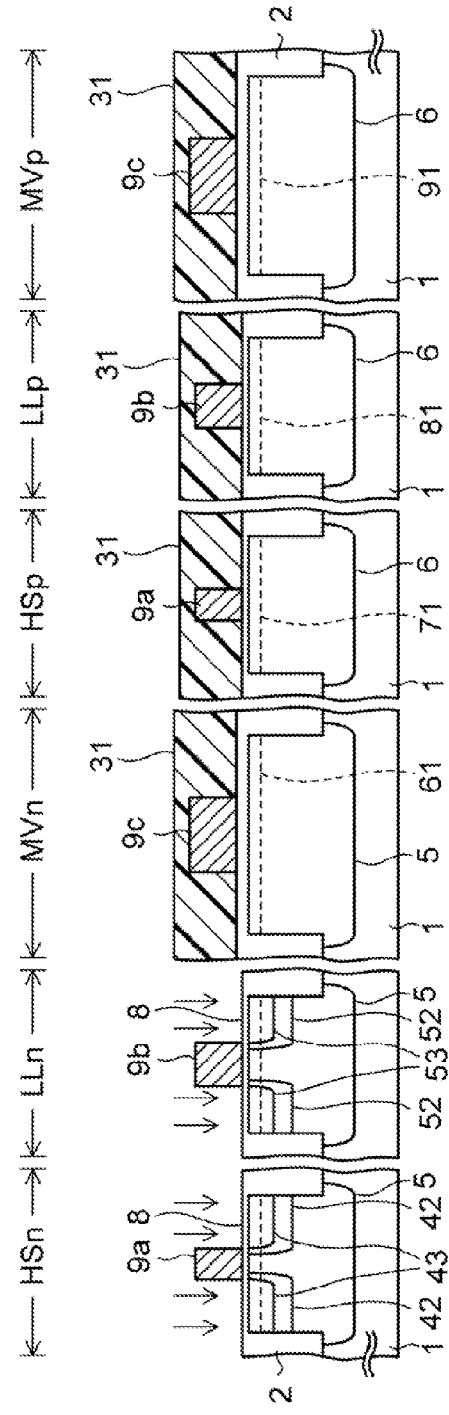
Figure 1Q:
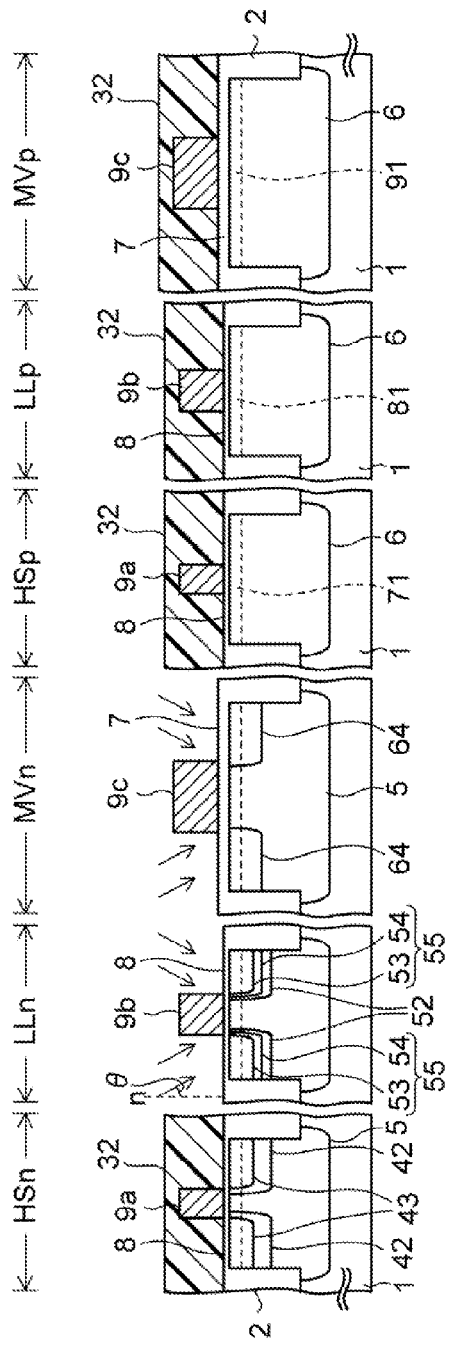
Figure 1R:
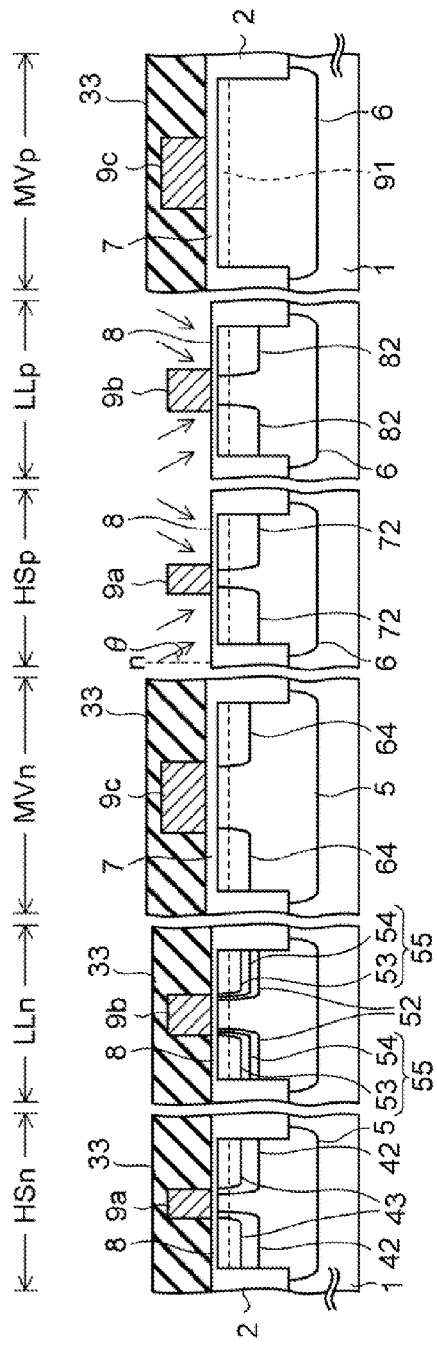
Figure 1S:
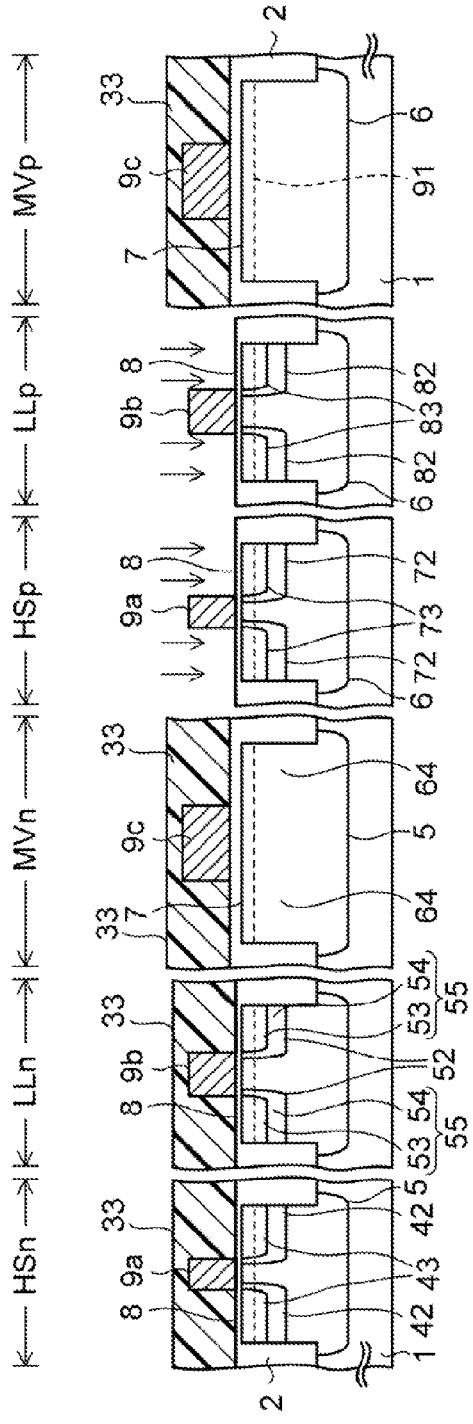
Figure 1T:
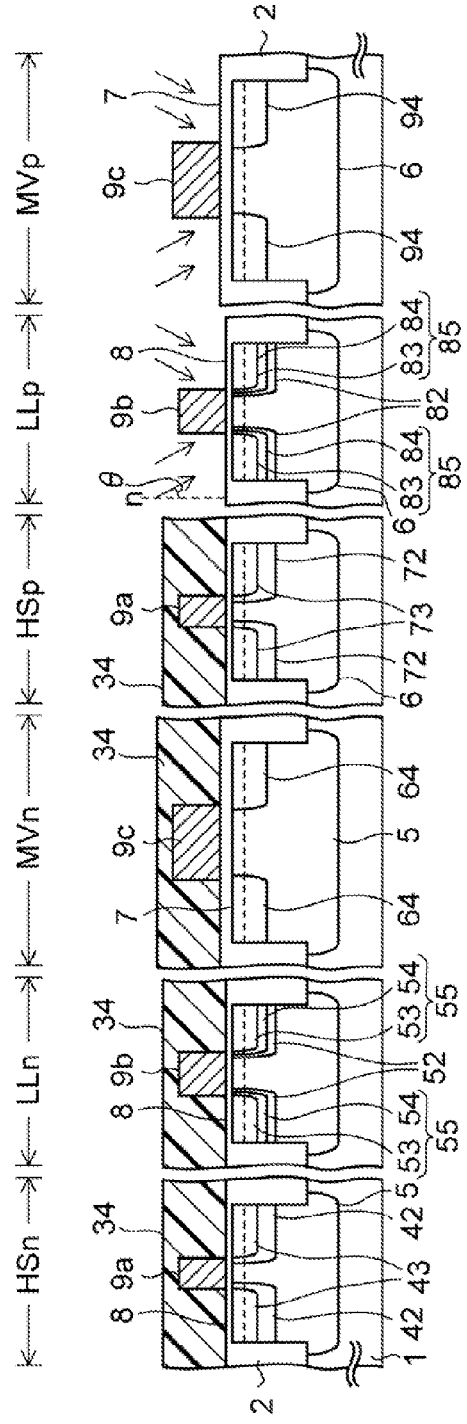
Figure 1U:
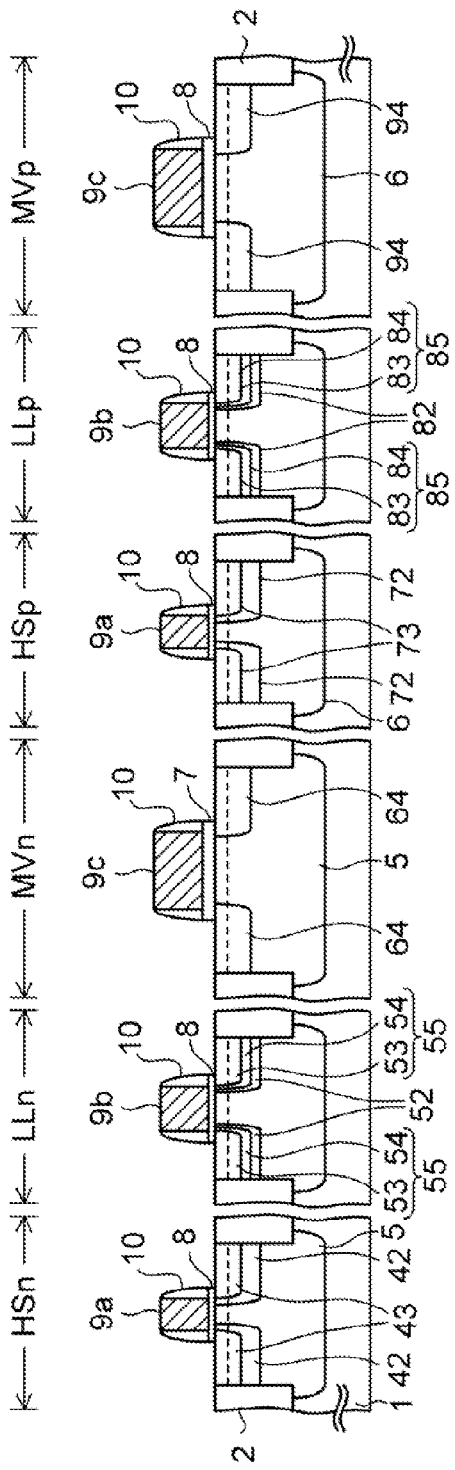
Figure 1V:
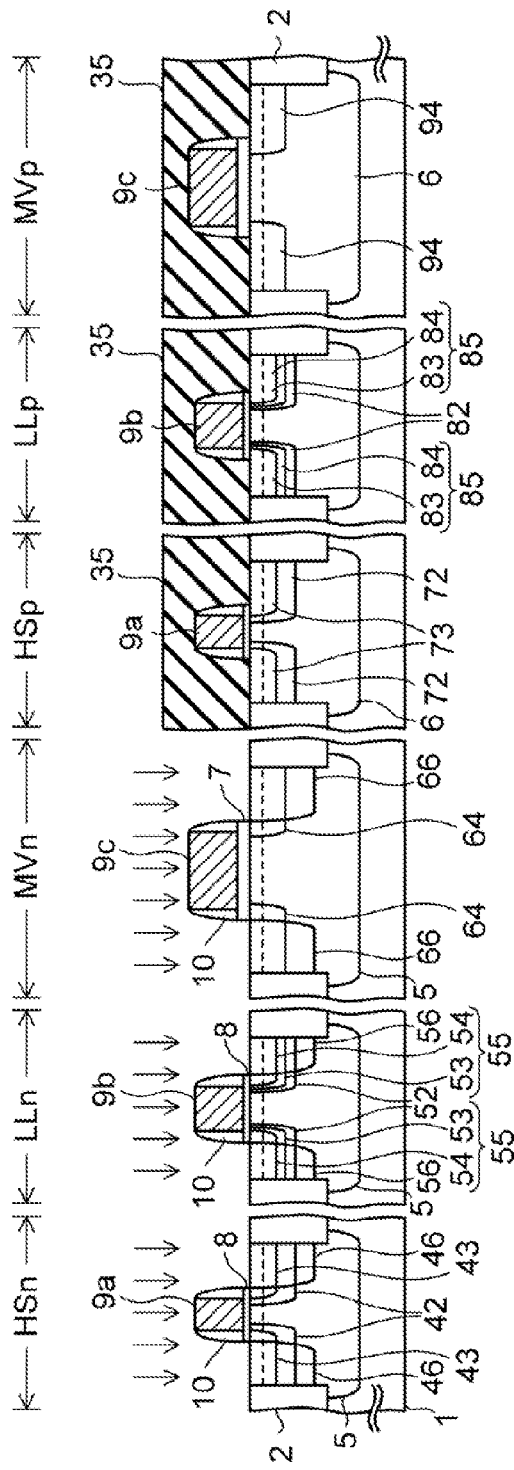
Figure 1W:
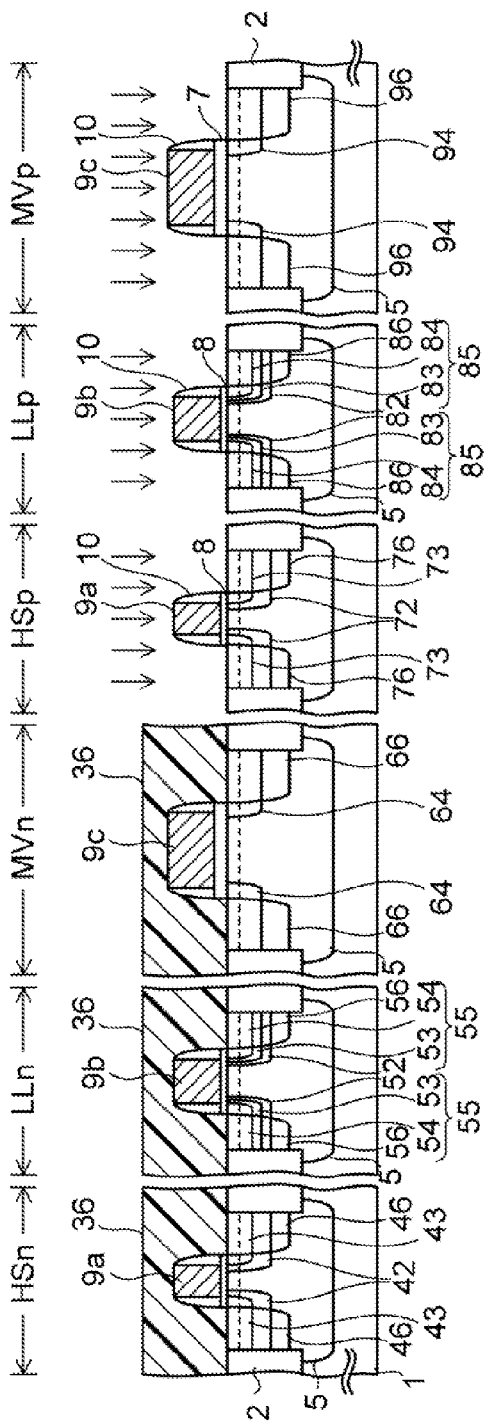
Figure 1X:
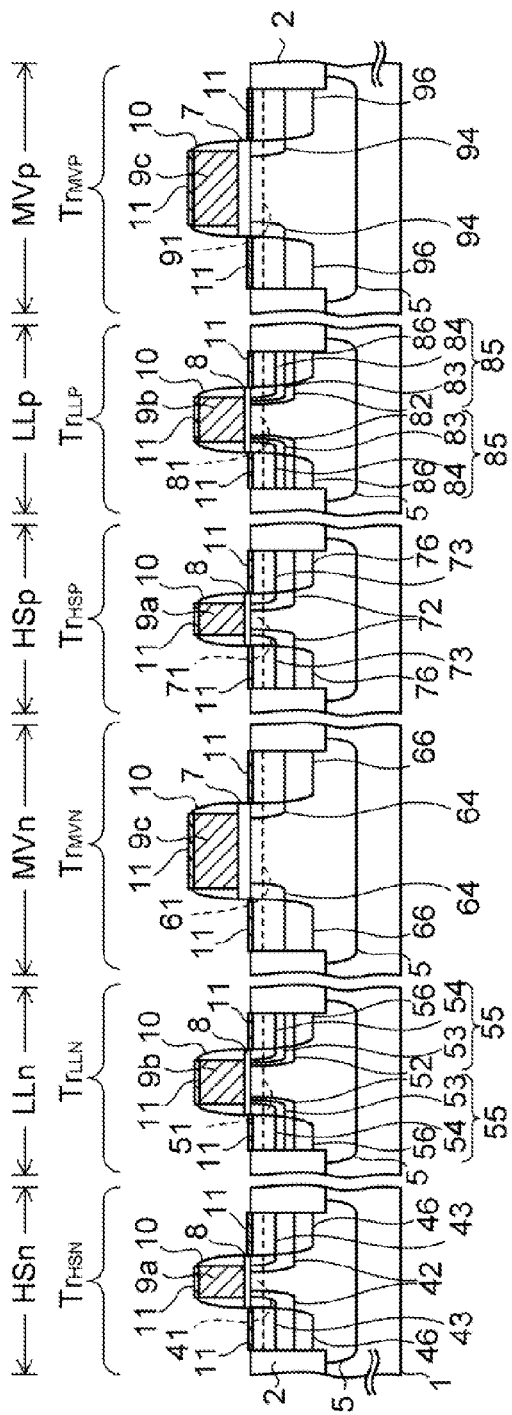
Figures 1Y, 1Z:
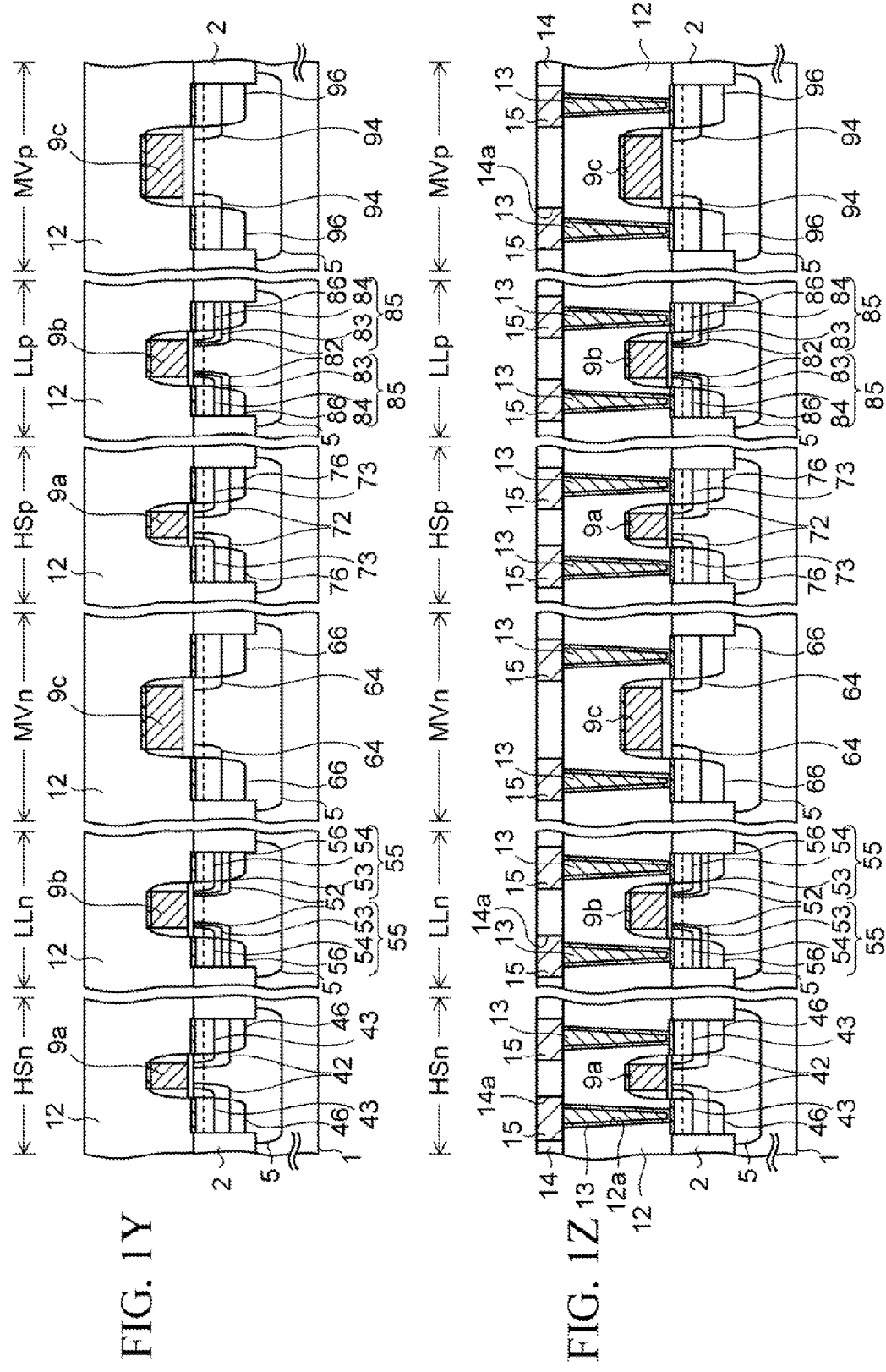

FIG. 1A to 1Z are cross-sectional views illustrating an example of a method of manufacturing a semiconductor device according to an embodiment, in the order of processes.

First of all, a silicon substrate is prepared as a semiconductor substrate 1 as illustrated in FIG. 1A. Then, an element isolation insulating film 2 for isolating element regions is formed by using the STI (Shallow Trench Isolation) method, for example. The element isolation insulating film 2 may be formed by using the LOCOS (Local Oxidation of Silicon) method instead.

In FIG. 1A, reference code HSn denotes a transistor forming region in which an n-type high speed transistor is to be formed, reference code LLn denotes a transistor forming region in which an n-type low leakage transistor is to be formed, and reference code MVn denotes a transistor forming region in which an n-type medium voltage transistor is to be formed. Meanwhile, reference code HSp denotes a transistor forming region in which a p-type high speed transistor is to be formed, reference code LLp denotes a transistor forming region in which a p-type low leakage transistor is to be formed, and reference code MVp denotes a transistor forming region in which a p-type medium voltage transistor is to be formed.

After the transistor forming regions HSn, LLn, MVn, HSp, LLp, and MVp are isolated from each other by the element isolation insulating film 2 as described above, a sacrifice insulating film 3 is formed by thermally oxidizing a surface of the semiconductor substrate 1. The thickness of the sacrifice insulating film 3 is 10 nm, for example.

Next, a photoresist film 21 is formed on the sacrifice insulating film 3 as illustrated in FIG. 1B. Then, this photoresist film 21 is subjected to exposure and development processes to provide openings from which the sacrifice insulating film 3 is exposed at portions corresponding to the n-type transistor forming regions HSn, LLn, and MVn.

Then, ions of a p-type impurity are implanted into the semiconductor substrate 1 while using the photoresist film 21 as a mask, and p wells 5 are respectively formed in the n-type transistor forming regions HSn, LLn, and MVn. Here, it is assumed that B (boron) is used as the p-type impurity and ion implantation is performed under conditions of an acceleration energy of 150 keV and a dosage of $3\times10^{13}$ cm$^{-2}$. Thereafter, the photoresist film 21 is removed.

Next, a photoresist film 22 is formed on the sacrifice insulating film 3 as illustrated in FIG. 1C. Then, this photoresist film 22 is subjected to exposure and development processes to provide openings from which the sacrifice insulating film 3 is exposed at portions corresponding to the p-type transistor forming regions HSp, LLp, and MVp.

Then, ions of an n-type impurity are implanted into the semiconductor substrate 1 while using the photoresist film 22 as a mask, and n wells are respectively formed in the p-type transistor forming regions HSp, LLp, and MVp. Here, it is assumed that P (phosphorus) is used as the n-type impurity and ion implantation is performed under conditions of an acceleration energy of 360 keV and a dosage of $3\times10^{13}$ cm$^{-2}$. Thereafter, the photoresist film 22 is removed.

Next, a photoresist film 23 is formed on the sacrifice insulating film 3 as illustrated in FIG. 1D. Then, this photoresist film 23 is subjected to exposure and development processes to provide an opening from which the sacrifice insulating film 3 is exposed at a portion corresponding to the n-type high speed transistor forming region HSn.

Then, ions of a p-type impurity are implanted into an upper portion of the p well 5 in the n-type high speed transistor forming region HSn while using the photoresist film 23 as a mask, and a channel region 41 is formed. Here, it is assumed that B (boron) is used as the p-type impurity and ion implantation is performed under conditions of an acceleration energy of 15 keV and a dosage of $7.2\times10^{12}$ cm$^{-2}$. Thereafter, the photoresist film 23 is removed.

Next, a photoresist film 24 is formed on the sacrifice insulating film 3 as illustrated in FIG. 1E. Then, this photoresist film 24 is subjected to exposure and development processes to provide an opening from which the sacrifice insulating film 3 is exposed at a portion corresponding to the n-type low leakage transistor forming region LLn.

Then, ions of a p-type impurity are implanted into an upper portion of the p well 5 in the n-type low leakage transistor forming region LLn while using the photoresist film 24 as a mask, and a channel region 51 is formed. Here, it is assumed that B (boron) is used as the p-type impurity and ion implantation is performed under conditions of an acceleration energy of 15 keV and a dosage of $1.4\times10^{13}$ cm$^{-2}$. Thereafter, the photoresist film 24 is removed.

Next, a photoresist film 25 is formed on the sacrifice insulating film 3 as illustrated in FIG. 1F. Then, this photoresist film 25 is subjected to exposure and development processes to form an opening from which the sacrifice insulating film 3 is exposed at a portion corresponding to the n-type medium voltage transistor forming region MVn.

Then, ions of a p-type impurity are implanted into an upper portion of the p well 5 in the n-type medium voltage transistor forming region MVn while using the photoresist film 25 as a mask, and a channel region 61 is formed. Here, it is assumed that B (boron) is used as the p-type impurity and ion implantation is performed under conditions of an acceleration energy of 15 keV and a dosage of $2.3\times10^{12}$ cm$^{-2}$. Thereafter, the photoresist film 25 is removed.

Next, a photoresist film 26 is formed on the sacrifice insulating film 3 as illustrated in FIG. 1G. Then, this photoresist film 26 is subjected to exposure and development processes to provide an opening from which the sacrifice insulating film 3 is exposed at a portion corresponding to the p-type high speed transistor forming region HSp.

Then, ions of an n-type impurity are implanted into an upper portion of the n well 6 in the p-type high speed transistor forming region HSp while using the photoresist film 26 as a mask, and a channel region 71 is formed. Here, it is assumed that P (phosphorus) is used as the n-type impurity and ion implantation is performed under conditions of an acceleration energy of 65 keV and a dosage of $2.9 \times 10^{12}$ cm$^{-2}$. Thereafter, the photoresist film 26 is removed.

Next, a photoresist film 27 is formed on the sacrifice insulating film 3 as illustrated in FIG. 1H. Then, this photoresist film 27 is subjected to exposure and development processes to provide an opening from which the sacrifice insulating film 3 is exposed at a portion corresponding to the p-type low leakage transistor forming region LLp.

Then, ions of an n-type impurity are implanted into an upper portion of the n well 6 in the p-type low leakage transistor forming region LLp while using the photoresist film 27 as a mask, and a channel region 81 is formed. Here, it is assumed that P (phosphorus) is used as the n-type impurity and ion implantation is performed under conditions of an acceleration energy of 65 keV and a dosage of $7.3 \times 10^{12}$ cm$^{-2}$. Thereafter, the photoresist film 27 is removed.

Next, a photoresist film 28 is formed on the sacrifice insulating film 3 as illustrated in FIG. 1I. Then, this photoresist film 28 is subjected to exposure and development processes to provide an opening from which the sacrifice insulating film 3 is exposed at a portion corresponding to the p-type medium voltage transistor forming region MVp.

Then, ions of an n-type impurity are implanted into an upper portion of the n well 6 in the p-type medium voltage transistor forming region MVp while using the photoresist film 28 as a mask, and a channel region 91 is formed. Here, it is assumed that P (phosphorus) is used as the n-type impurity and ion implantation is performed under conditions of an acceleration energy of 125 keV and a dosage of $3.2 \times 10^{12}$ cm$^{-2}$. Thereafter, the photoresist film 28 is removed.

The impurity concentrations of the channel regions 41, 51, 61, 71, 81, and 91 relate to threshold voltages of the transistors to be formed in the transistor forming regions HSn, LLn, MVn, HSp, LLp, and MVp, respectively. The order of the processes for forming the channel regions 41, 51, 61, 71, 81, and 91 is not limited to the above-described order and may be carried out in any order.

Next, the sacrifice insulating film 3 is removed to expose a clean surface of the semiconductor substrate 1 as illustrated in FIG. 1J. The sacrifice insulating film 3 is removed by wet etching using a hydrofluoric acid solution, for example.

Next, as illustrated in FIG. 1K, the surface of the semiconductor substrate 1 is thermally oxidized to form a gate insulating film 7 in each of the transistor forming regions HSn, LLn, MVn, HSp, LLp, and MVp. This thermal oxidation process is carried out in an oxygen atmosphere under a condition of a substrate temperature of about 800° C., for example. The thickness of the gate insulating film 7 is 6 nm, for example.

Next, a photoresist film 29 is formed on an entire upper surface of the semiconductor substrate 1 as illustrated in FIG. 1L. Then, this photoresist film 29 is subjected to exposure and development processes to provide openings from which the gate insulating film 7 is exposed at portions corresponding to the high speed transistor forming regions HSn and HSp and the low leakage transistor forming regions LLn and LLp.

Next, wet etching is carried out while using the photoresist film 29 as a mask to remove the gate insulating film 7 in each of the high speed transistor forming regions HSn and HSp and in the low leakage transistor forming regions LLn and LLp. The gate insulating film 7 is removed by wet etching using a hydrofluoric acid solution as an etchant, for example. Thereafter, the photoresist film 29 is removed.

Next, as illustrated in FIG. 1M, a gate insulating film 8 is formed in each of the high speed transistor forming regions HSn and HSp and the low leakage transistor forming regions LLn and LLp by thermally oxidizing the surface of the semiconductor substrate 1.

The high speed transistors and the low leakage transistors to be formed in the high speed transistor forming regions HSn and HSp and the low leakage transistor forming regions LLn and LLp are operated at a lower voltage than the medium voltage transistors to be formed in the medium voltage transistor forming regions MVn and MVp. Accordingly, it is important to set the thickness of the gate insulating film 8 smaller than that of the gate insulating film 7. Here, the thickness of the gate insulating film 8 is about 1.8 nm.

Subsequently, the processes for obtaining a cross-sectional structure illustrated in FIG. 1N will be described.

First, a conductive film 9 is formed on the gate insulating film 7 and the gate insulating film 8. Here, a polycrystalline silicon film formed by using the CVD (Chemical Vapor Deposition) method is used as the conductive film 9 and the thickness thereof is about 105 nm.

Next, a photoresist film 30 is formed on the conductive film 9. This photoresist film 30 is subjected to exposure and development processes and is thereby formed to have a predetermined pattern (a shape of gate electrodes). Then, the conductive film 9 is dry etched while using this photoresist film 30 as a mask, and thus gate electrodes 9a, 9b, and 9c are formed. Here, the gate electrodes 9a are gate electrodes in the high speed transistor forming regions HSn and HSp, the gate electrodes 9b are gate electrodes in the low leakage transistor forming regions LLn and LLp, and the gate electrodes 9c are gate electrodes in the medium voltage transistor forming regions MVn and MVp.

It is preferable that the length of the gate electrode of a transistor operating at a higher voltage is made longer. In this embodiment, the length of each of the gate electrodes 9c in the medium voltage transistor forming regions MVn and MVp is about 350 nm.

Meanwhile, it is preferable that the length of the gate electrode of a transistor focused on high speed operation is made short. In this embodiment, the length of each of the gate electrodes 9a in the high speed transistor forming regions HSn and HSp is about 60 nm. Meanwhile, the length of each of the gate electrodes 9b in the low leakage transistor forming regions LLn and LLp is about 85 nm.

The photoresist film 30 is removed after the gate electrodes 9a, 9b, and 9c are formed in the high speed transistor forming regions HSn and HSp, the low leakage transistor forming regions LLn and LLp, and the medium voltage transistor forming regions MVn and MVp in this way.

Next, a photoresist film 31 is formed on the entire upper surface of the semiconductor substrate 1 as illustrated in FIG. 1O. Then, this photoresist film 31 is subjected to exposure and development processes, and openings are thereby formed at the portions corresponding to the n-type high speed transistor forming region HSn and the n-type low leakage transistor forming region LLn to expose the gate electrodes 9a and 9b in the transistor forming regions HSn and LLn.

Thereafter, ions of a p-type impurity are implanted into the upper portions of the p wells 5 in the n-type high speed transistor forming region HSn and the n-type low leakage transistor forming region LLn while using the photoresist film 31 and the gate electrodes 9a and 9b as a mask. By this ion implantation process, p-type pocket regions 42 are formed in the n-type high speed transistor forming region HSn and p-type pocket regions 52 are formed in the n-type low leakage transistor forming region LLn.

In this ion implantation process, B (boron) is used as the p-type impurity, and ion implantation is performed in four operations while the semiconductor substrate 1 is turned by 90° for each operation, for example. Each operation of ion implantation process is performed under conditions of an acceleration energy of 7 keV, a dosage of $9\times10^{12}$ cm$^{-2}$, and a tilt angle θ of 28°, for example. Here, the tilt angle θ is an angle defined between a direction perpendicular to the surface of the semiconductor substrate 1 and a direction of the ion implantation.

Performing the ion implantation from a direction inclined with respect to the surface of the semiconductor substrate 1 as described above causes the p-type pocket regions 42 and 52 to spread also to regions below edges of the gate electrodes 9a and 9b. As a consequence, the concentrations of the p-type impurity in the channel regions below the gate electrodes 9a and 9b are increased. Hence it may be possible to suppress the short channel effect therein.

B (boron) used as the p-type impurity in this process has a greater diffusion coefficient inside the semiconductor substrate than other p-type impurities such as In (indium). Accordingly, B is diffused inside the semiconductor substrate by the heat applied in the course of manufacturing the transistors, and relatively gentle impurity profiles are thus formed. In this way, it may be possible to suppress a junction leakage at a pn junction between the extension region and the channel region of the low leakage transistor to be formed in the low leakage transistor forming region LLn.

Here, when the pocket regions 42 are formed by implanting ions of B (boron), there is a concern that the short channel effect of the n-type high speed transistor is more likely to occur than the case of using In (indium) or the like. However, as a result of investigation conducted by the inventors, it is confirmed that an electrical characteristic (the threshold voltage) of the n-type high speed transistor indicates little change when B is used instead of In.

Next, as illustrated in FIG. 1P, ions of an n-type impurity are implanted into the p wells 5 in the n-type high speed transistor forming region HSn and the n-type low leakage transistor forming region LLn while continuously using the photoresist film 31 and the gate electrodes 9a and 9b as the mask. In this ion implantation process, ion implantation is performed in four operations while the semiconductor substrate 1 is turned by 90° for each operation, for example. Here, As (arsenic) is assumed to be used as the n-type impurity. Each operation of ion implantation process is performed under conditions of acceleration energy of 1 keV, a dosage of $2.7\times10^{14}$ cm$^{-2}$, and a tilt angle θ of 0°, for example.

By this ion implantation process, n-type extension regions 43 are formed to be shallower than the p-type pocket regions 42, in the n-type high speed transistor forming region HSn. In addition, first n-type impurity regions 53 are formed to be shallower than the p-type pocket regions 52, in the n-type low leakage transistor forming region LLn.

As (arsenic) used as the n-type impurity in this process has a smaller diffusion coefficient than that of P (phosphorus). Accordingly, migration of the n-type impurity (As) inside the semiconductor substrate 1 by the heat applied in the course of manufacturing the transistors is suppressed, and thus the impurity profiles in the n-type extension regions 43 are prevented from collapsing. Hence, it may be possible to suppress the short channel effect of the n-type high speed transistor having the short gate length.

The photoresist film 31 is removed after the n-type extension regions 43 and the first n-type impurity regions 53 are formed as described above.

Next, a photoresist film 32 is formed on the entire upper surface of the semiconductor substrate 1 as illustrated in FIG. 1Q. Then, this photoresist film 32 is subjected to exposure and development processes, and openings are thereby formed at the portions corresponding to the n-type low leakage transistor forming region LLn and the n-type medium voltage transistor forming region MVn to expose the gate electrodes 9b and 9c in the transistor forming regions LLn and MVn.

Subsequently, ions of an n-type impurity are implanted into the upper portions of the p wells 5 in the n-type low leakage transistor forming region LLn and the n-type medium voltage transistor forming region MVn while using the photoresist film 32 and the gate electrodes 9b and 9c as a mask. Here, in the ion implantation process, it is assumed that P (phosphorus) is used as the n-type impurity and ion implantation is performed in four operations while the semiconductor substrate 1 is turned by 90° for each operation. Each operation of the ion implantation process is performed under conditions of an acceleration energy of 35 keV, a dosage of $3.0\times10^{12}$ cm$^{-2}$, and a tilt angle θ of 28°, for example.

By this ion implantation process, second n-type impurity regions 54 are formed to be deeper than the first n-type impurity regions 53 and shallower than the p-type pocket regions 52, in the n-type low leakage transistor forming region LLn. Thus, n-type extension regions 55 including the first n-type impurity regions 53 and the second n-type impurity regions 54 are finished. In addition, n-type extension regions 64 are formed in the n-type medium voltage transistor forming region MVn.

P (phosphorus) used as the n-type impurity in this process has a larger diffusion coefficient than that of As (arsenic). Accordingly, the n-type impurity (P) inside the semiconductor substrate 1 migrates greatly by the heat applied in the course of manufacturing the transistors, and thus the impurity profiles in the n-type extension regions 55 become gentle. Hence, when the voltage is applied between the n-type extension regions 55 and the p well 5, a potential change at the pn junction therebetween is moderated and the withstand voltage of the pn junction is thereby improved.

The photoresist film 32 is removed after the extension regions 55 and 64 are formed in the process described above.

Next, a photoresist film 33 is formed on the entire upper surface of the semiconductor substrate 1 as illustrated in FIG. 1R. Then, this photoresist film 33 is subjected to exposure and development processes, and openings are thereby formed at the portions corresponding to the p-type high speed transistor forming region HSp and the p-type low leakage transistor forming region LLp to expose the gate electrodes 9a and 9b in the transistor forming regions HSp and LLp.

Subsequently, ions of an n-type impurity are implanted into the upper portions of the n wells 6 in the p-type high speed transistor forming region HSp and the p-type low leakage transistor forming region LLp while using the photoresist film 33 and the gate electrodes 9a and 9b as a mask. Hence, n-type pocket regions 72 are formed in the p-type high speed transistor forming region HSp while n-type pocket regions 82 are formed in the low leakage transistor forming region LLp. Here, in the ion implantation process, it is assumed that As (arsenic) is used as the n-type impurity and ion implantation is performed in four operations while the semiconductor substrate 1 is turned by 90° for each operation. Each operation of the ion implantation process is performed under conditions of an acceleration energy of 60 keV, a dosage of $5.2\times10^{12}$ cm$^{-2}$, and a tilt angle θ of 28°, for example.

Next, as illustrated in FIG. 1S, ions of a p-type impurity are implanted into the upper portions of the n wells 6 in the p-type high speed transistor forming region HSp and the p-type low leakage transistor forming region LLp while continuously using the photoresist film 33 and the gate electrodes 9a and 9b as the mask. In this ion implantation process, it is assumed that B (boron) is used as the p-type impurity and ion implantation is performed in four operations while the semiconductor substrate 1 is turned by 90° for each operation. Each operation of the ion implantation process is performed under conditions of acceleration energy of 0.3 keV, a dosage of $1.0 \times 10^{14}$ cm$^{-2}$, and a tilt angle θ of 0°, for example.

By this ion implantation process, p-type extension regions 73 are formed to be shallower than the n-type pocket regions 72, in the p-type high speed transistor forming region HSp. In addition, first p-type impurity regions 83 are formed to be shallower than the n-type pocket regions 82, in the p-type low leakage transistor forming region LLp.

The photoresist film 33 is removed after the p-type extension regions 73 and the first p-type impurity regions 83 are formed in the process described above.

Next, a photoresist film 34 is formed on the entire upper surface of the semiconductor substrate 1 as illustrated in FIG. 1T. Then, this photoresist film 34 is subjected to exposure and development processes, and openings are thereby provided at the portions corresponding to the p-type low leakage transistor forming region LLp and p-type medium voltage transistor forming region MVp to expose the gate electrodes 9b and 9c in the transistor forming regions LLp and MVp.

Subsequently, ions of a p-type impurity are implanted into the upper portions of the n wells 6 in the p-type low leakage transistor forming region LLp and p-type medium voltage transistor forming region MVp while using the photoresist film 34 and the gate electrodes 9b and 9c as a mask. Here, the ion implantation process is assumed to be performed by using B (boron) as the p-type impurity, under conditions of an acceleration energy of 3 keV, a dosage of $2.0 \times 10^{13}$ cm$^{-2}$, and a tilt angle θ of 0°, for example.

By this ion implantation process, second p-type impurity regions 84 are formed to be deeper than the first p-type impurity regions 83 and shallower than the n-type pocket regions 82, in the p-type low leakage transistor forming region LLp. Thus, p-type extension regions 85 including the first p-type impurity regions 83 and the second p-type impurity regions 84 are finished. In addition, p-type extension regions 94 are formed in the p-type medium voltage transistor forming region MVp.

Here, B (boron) implanted into the p-type extension regions 85 is diffused by the heat applied in the course of manufacturing the transistors, and forms a relatively gentle impurity profile. Accordingly, a leakage current of the transistor to be formed in the low leakage transistor forming region LLp is reduced.

The photoresist film 34 is removed after the p-type extension regions 85 and 94 are formed in the process described above.

Next, a silicon oxide film is formed in a thickness of about 70 nm on the entire upper surface of the semiconductor substrate 1 by using the CVD method, for example. As illustrated in FIG. 1U, this insulating film is etched back to form side walls 10 on both sides of each of the gate electrodes 9a, 9b, and 9c.

Next, as illustrated in FIG. 1V, a photoresist film 35 is formed on the entire upper surface of the semiconductor substrate 1, and is then subjected to exposure and development processes to provide openings at the portions corresponding to the n-type transistor forming regions HSn, LLn, and MVn.

Then, ions of an n-type impurity are implanted into the upper portions of the p wells 5 in the n-type transistor forming regions HSn, LLn, and MVn while using the photoresist film 35, the gate electrodes 9a, 9b, and 9c, and the side walls as a mask. Hence, source and drain regions 46 are formed in the n-type high speed transistor forming region HSn, source and drain regions 56 are formed in the n-type low leakage transistor forming region LLn, and source and drain regions 66 are formed in the n-type medium voltage transistor forming region MVn. Here, the ion implantation process is assumed to be performed by using P (phosphorus) as the n-type impurity, in two operations. The first operation is performed under conditions of an acceleration energy of 15 keV, a dosage of $5.0 \times 10^{13}$ cm$^{-2}$, and a tilt angle θ of 0°, for example. The second operation is performed under conditions of an acceleration energy of 8 keV, a dosage of $1.2 \times 10^{16}$ cm$^{-2}$, and a tilt angle θ of 0°, for example.

After this ion implantation process, the photoresist film 35 is removed.

Next, as illustrated in FIG. 1W, a photoresist film 36 is formed on the entire upper surface of the semiconductor substrate 1, and is then subjected to exposure and development processes to provide openings at the portions corresponding to the p-type transistor forming regions HSp, LLp, and MVp.

Then, ions of a p-type impurity are implanted into the upper portions of the n wells 6 in the p-type transistor forming regions HSp, LLp, and MVp while using the photoresist film 36, the gate electrodes 9a, 9b, and 9c, and the side walls as a mask. Hence, source and drain regions 76 are formed in the p-type high speed transistor forming region HSp, source and drain regions 86 are formed in the p-type low leakage transistor forming region LLp, and source and drain regions 96 are formed in the p-type medium voltage transistor forming region MVn. Here, the ion implantation process is assumed to be performed by using B (boron) as the p-type impurity, in two operations. The first operation is performed under conditions of an acceleration energy of 8 keV, a dosage of $1.0 \times 10^{13}$ cm$^{-2}$, and a tilt angle θ of 0°, for example. The second operation is performed under conditions of an acceleration energy of 4 keV, a dosage of $6.0 \times 10^{15}$ cm$^{-2}$, and a tilt angle θ of 0°, for example.

After this ion implantation process, the photoresist film 36 is removed.

Subsequently, a film of high melting point metal such as Co (cobalt) is formed on the entire upper surface of the semiconductor substrate 1 by using a sputtering method, for example. Thereafter, the high melting point metal is subjected to a heat treatment at a predetermined temperature (such as 630° C.) to react with silicon in the semiconductor substrate 1 and the gate electrodes 9a, 9b, and 9c. Then, the unreacted high melting point metal is removed by wet etching. In this way, a silicide film 11 is formed on the source and drain regions 46, 56, 66, 76, 86, and 96 and on the gate electrodes 9a, 9b, and 9c as illustrated in FIG. 1X.

Accordingly, an n-type high speed transistor $Tr_{HSN}$ is formed in the n-type high speed transistor forming region HSn, an n-type low leakage transistor $Tr_{LLN}$ is formed in the n-type low leakage transistor forming region LLn, and an n-type medium voltage transistor $Tr_{MVN}$ is formed in the n-type medium voltage transistor forming region MVn. Furthermore, a p-type high speed transistor $Tr_{HSP}$ is formed in the p-type high speed transistor forming region HSp, a p-type low leakage transistor $Tr_{LLP}$ is formed in the p-type low leakage transistor forming region LLp, and a p-type medium voltage transistor $Tr_{MVP}$ is formed in the p-type medium voltage transistor forming region MVp.

Next, a first interlayer insulating film 12 is formed on the entire upper surface of the semiconductor substrate 1 as illustrated in FIG. 1Y. The first interlayer insulating film 12 is formed by depositing silicon oxide by using the CVD method, for example. Thereafter, an upper surface of the first interlayer insulating film 12 is polished and planarized by using the CMP (Chemical Mechanical Polishing) method. The thickness of the first interlayer insulating film 12 after planarization is about 270 nm, for example.

Subsequently, as illustrated in FIG. 1Z, contact holes 12a each extending from the upper surface of the first interlayer insulating film 12 to a corresponding one of the source and drain regions 46, 56, 66, 76, 86, and 96 are formed by use of a photolithographic method and an etching method. Thereafter, a glue film is formed on the entire upper surface of the semiconductor substrate 1 to cover inner surfaces of the contact holes 12a and the upper surface of the first interlayer insulating film 12. The glue film is formed by stacking a titanium film and a titanium nitride film in this order, for example, and may be formed by using the sputtering method.

Next, tungsten (W) is deposited on the semiconductor substrate 1 by using the CVD method, and the contact holes 12a are thus filled with tungsten. Thereafter, the excessive glue film and excessive tungsten on the first interlayer insulating film 12 are removed by using the CMP method. Tungsten remaining inside the contact holes 12a serves as conductive plugs 13.

Next, silicon oxide is deposited on the first interlayer insulating film 12 and the conductive plugs 13 by using the CVD method, for example, to form a second interlayer insulating film 14.

Subsequently, openings 14a are formed in the second interlayer insulating film 14 in a predetermined pattern (a wiring pattern) by using the photolithographic method and the etching method. Thereafter, metal wiring 15 is formed by burying metal such as Cu (copper) into the openings 14a. Hence, the semiconductor device of this embodiment is finished.

In this embodiment, as described above with reference to FIG. 1O to FIG. 1T, the pocket regions 52 in the low leakage transistor forming region LLn and the pocket regions 42 in the high speed transistor forming region HSn are formed in the same ion implantation process. Moreover, the first impurity regions 53 being part of the extension regions 55 in the low leakage transistor forming region LLn and the extension regions 43 in the high speed transistor forming region HSn are formed in the same ion implantation process. Furthermore, the second impurity regions 54 being part of the extension regions 55 in the low leakage transistor forming region LLn and the extension regions 64 in the medium voltage transistor forming region MVn are formed in the same ion implantation process.

As described above, a common ion implantation process is performed for the pocket regions 52 in the low leakage transistor forming region LLn and for the transistor forming region HSn, and a common ion implantation process is performed for the extension regions 55 in the low leakage transistor forming region LLn and for the transistor forming region MVn. Hence, the number of manufacturing processes is reduced.

Meanwhile, a common ion implantation process is performed for the pocket regions 82 in the low leakage transistor forming region LLp and for the transistor forming region HSp, and a common ion implantation process is performed for the extension regions 85 in the low leakage transistor forming region LLp and for the transistor forming region MVp. Hence, the number of manufacturing processes is also reduced for the p-type transistor forming regions HSp, LLp, and MVp.

Next, a result of investigation of a relationship between a threshold voltage Vt and a gate length L in the n-type low leakage transistor formed in the embodiment (hereinafter referred to as an example) will be described in comparison with an n-type low leakage transistor of a comparative example.

Here, a basic structure of the n-type low leakage transistor of the comparative example is similar to that of the low leakage transistor $Tr_{LLn}$ (see FIG. 1X) of the example. However, p-type pocket regions of the transistor of the comparative example are formed in an ion implantation in which ions of B (boron) as the impurity are implanted in four operations while the semiconductor substrate is turned by 90° for each operation. Each operation of the ion implantation process is performed under conditions of an acceleration energy at 7 keV, a dosage of $9.0 \times 10^{12}$ cm$^{-2}$, and a tilt angle θ of 28°.

Furthermore, first n-type impurity regions of the transistor of the comparative example are formed in an ion implantation process in which ions of As (arsenic) as the impurity are implanted in four operations while the semiconductor substrate is turned by 90° for each operation. Each operation of the ion implantation process is performed under conditions of an acceleration energy at 1 keV, a dosage of $1.4 \times 10^{14}$ cm$^{-2}$, and a tilt angle θ of 0°.

In addition, a second n-type impurity regions of the transistor of the comparative example are formed in an ion implantation process in which ions of P (phosphorous) as the impurity are implanted in four operations while the semiconductor substrate is turned by 90° for each operation. Each operation of ion implantation process is performed under conditions of an acceleration energy at 1 keV, a dosage of $0.9 \times 10^{14}$ cm$^{-2}$, and a tilt angle θ of 0°.

Figure 2B:
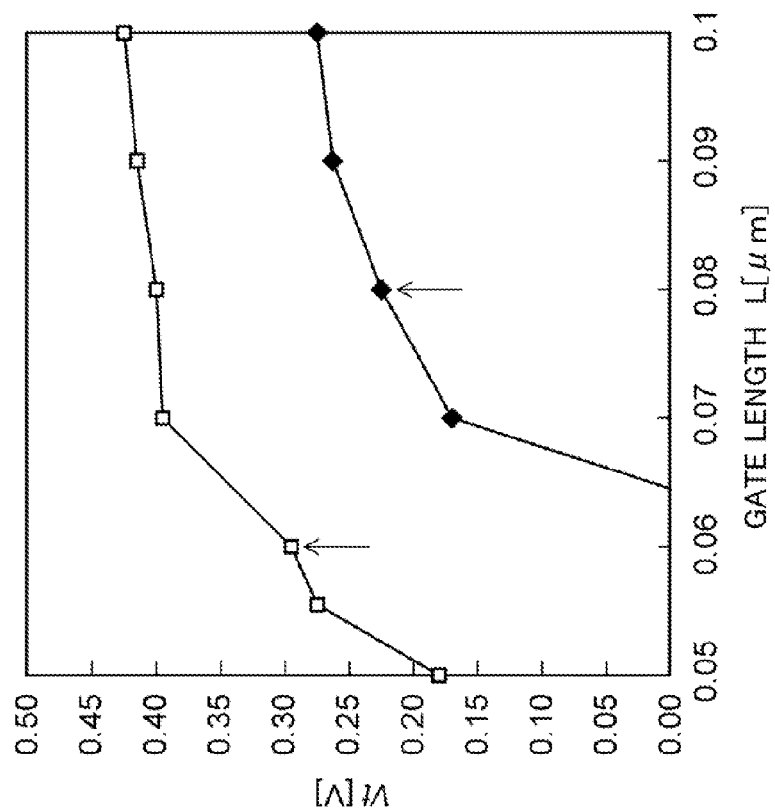
FIGS. 2A and 2B are graphs illustrating relationships between a threshold voltage Vt and a gate length L in low leakage transistors of an example and a comparative example.
Figure 2A:
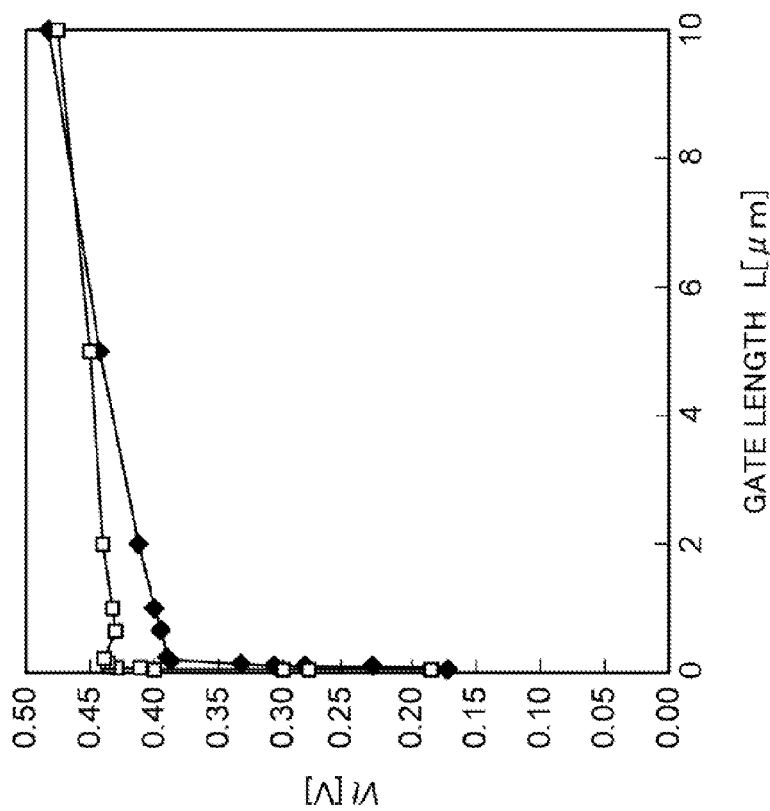

FIG. 2A is a graph illustrating the relationships (roll-off characteristics) between the threshold voltage Vt and the gate length L of the n-type low leakage transistors of the example and the comparative example. FIG. 2B is a graph obtained by partially extracting and expanding the graph in FIG. 2A in a range of the horizontal axis (the gate length L) from 0.05 μm to 0.10 μm. Here, a gate length dependency of the threshold voltage Vt (an inclination of the roll-off characteristic) reflects the magnitude of variation of a characteristic (threshold voltage characteristic) of the transistor relative to variation in processing the gate length. Therefore, it is preferable to set the gate length appropriately in a way that the inclination of the roll-off characteristic is equal to or below a predetermined value.

As apparent from FIGS. 2A and 2B, the low leakage transistor of the example may achieve the inclination of the roll-off characteristic equivalent to that of the comparative example by making the gate length L longer than that of the low leakage transistor of the comparative example by about 20 nm. Therefore, in order to achieve the similar characteristic as that of the comparative example, it is preferable to make the gate length of the low leakage transistor of the example longer than the gate length (about 60 nm) of the low leakage transistor of the comparative example by about 20 nm.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method of manufacturing a semiconductor device, the method comprising:
    forming a first gate insulating film in a first region of a semiconductor substrate;
    forming a second gate insulating film being thinner than the first gate insulating film in each of a second region and a third region of the semiconductor substrate;
    forming a first gate electrode, a second gate electrode, and a third gate electrode respectively on the first and second gate insulating films in the first region, the second region, and the third region;
    forming a first resist film covering the first region and having openings in the second region and the third region;
    forming pocket regions respectively on both sides of each of the second gate electrode and the third gate electrode by implanting ions of a first impurity of a first conductivity type into the semiconductor substrate while using the first resist film, the second gate electrode, and the third gate electrode as a mask;
    forming first extension regions respectively on both sides of the second gate electrode and first impurity regions respectively on both sides of the third gate electrode by implanting ions of a second impurity of a second conductivity type into the semiconductor substrate down to a depth shallower than the ions of the first impurity while using the first resist film as a mask;
    after removing the first resist film, forming a second resist film covering the second region and having openings in the first region and the third region;
    forming third extension regions respectively on both sides of the first gate electrode and second impurity regions respectively on both sides of the third gate electrode by implanting ions of a third impurity of the second conductivity type into the semiconductor substrate down to a depth shallower than the ions of the first impurity and deeper than the ions of the second impurity while using the second resist film, the first gate electrode, and the third gate electrode as a mask; and
    after removing the second resist film, forming source and drain regions respectively on both sides of each of the first gate electrode, the second gate electrode, and the third gate electrode by implanting ions of a fourth impurity of the second conductivity type into the semiconductor substrate down to a depth deeper than the ions of the first impurity.

2. The method of manufacturing a semiconductor device according to claim 1, wherein a diffusion coefficient of the second impurity is smaller than a diffusion coefficient of the third impurity.

3. The method of manufacturing a semiconductor device according to claim 1, wherein the first impurity is boron.

4. The method of manufacturing a semiconductor device according to claim 3, wherein
    the second impurity is arsenic, and
    the third impurity is phosphorous.

5. The method of manufacturing a semiconductor device according to claim 1, wherein the first impurity is arsenic.

6. The method of manufacturing a semiconductor device according to claim 5, wherein the second impurity and the third impurity are both boron.

7. The method of manufacturing a semiconductor device according to claim 1, wherein the ions of the first impurity are implanted into the semiconductor substrate from a direction inclined with respect to a normal line of the semiconductor substrate in the forming the pocket regions.

8. The method of manufacturing a semiconductor device according to claim 1, wherein the ions of the third impurity are implanted into the semiconductor substrate from a direction inclined with respect to the normal line of the semiconductor substrate in the forming the second impurity regions and the third extension regions.

* * * * *